US005927560A

United States Patent [19]
Lewis et al.

[11] Patent Number: 5,927,560
[45] Date of Patent: Jul. 27, 1999

[54] DISPENSING PUMP FOR EPOXY ENCAPSULATION OF INTEGRATED CIRCUITS

[75] Inventors: Alan Lewis, Carlsbad; Eric L. Austin, Del Mar; Alec Babiarz, Encinitas; John Newbold, San Diego, all of Calif.

[73] Assignee: Nordson Corporation, Westlake, Ohio

[21] Appl. No.: 08/828,569

[22] Filed: Mar. 31, 1997

[51] Int. Cl.⁶ .................................................. G01F 11/00
[52] U.S. Cl. .......................................... 222/263; 222/386
[58] Field of Search ............................. 222/63, 386, 263, 222/319

[56] References Cited

U.S. PATENT DOCUMENTS

| | | | |
|---|---|---|---|
| 1,327,686 | 1/1920 | Rose | 222/319 X |
| 2,540,390 | 2/1951 | Gorgerat et al. . | |
| 3,112,191 | 11/1963 | Anderson . | |
| 3,136,455 | 6/1964 | Coes, Jr. | 222/319 |
| 3,543,752 | 12/1970 | Hesse et al. . | |
| 3,851,801 | 12/1974 | Roth | 222/146 |
| 4,259,975 | 4/1981 | Kinsey, Jr. et al. . | |
| 4,493,350 | 1/1985 | Beikel et al. . | |
| 4,572,103 | 2/1986 | Engel . | |
| 4,597,507 | 7/1986 | Rosenblum et al. . | |
| 4,700,870 | 10/1987 | Schleicher et al. . | |
| 4,877,188 | 10/1989 | Ritter . | |
| 5,074,443 | 12/1991 | Fujii et al. . | |
| 5,148,946 | 9/1992 | Mizuta et al. . | |
| 5,277,342 | 1/1994 | Dickau et al. . | |
| 5,313,818 | 5/1994 | Sayka et al. . | |
| 5,509,954 | 4/1996 | Derian et al. . | |
| 5,564,606 | 10/1996 | Engel . | |
| 5,607,581 | 3/1997 | Gerner et al. . | |

FOREIGN PATENT DOCUMENTS

| | | |
|---|---|---|
| 0270207 | 6/1988 | European Pat. Off. . |
| 0322729 | 7/1989 | European Pat. Off. . |
| 0375462 | 6/1990 | European Pat. Off. . |
| 0589802 | 3/1994 | European Pat. Off. . |
| 0608129 | 7/1994 | European Pat. Off. . |
| 3841474 | 6/1990 | Germany . |

OTHER PUBLICATIONS

Tri–Continent Scientific, "Accupump Modular Liquid–Handling System", Doc. 7703–01, pp. 1–4.
PFC Precision Series, "PD–9000".
Dispensit Model 1000 Series, "Rod Positive Displacement Dispense Valve", 1993.
Microelectronics Journal, "Dispensing answers the call: Speed, accuracy, and flexibility meet PCB assembly needs", vol. 28, 1997, pp. vii–xi. Jan. 1997.

*Primary Examiner*—Gregory L. Huson
*Attorney, Agent, or Firm*—Wood, Herron & Evans, L.L.P.

[57] ABSTRACT

A dispensing pump for dispensing liquid, particularly suitable for dispensing two-part epoxy for encapsulation of integrated circuits, includes a pumping chamber in communication with a nozzle via a three way valve, the pumping chamber including an outlet, an internal volume, a pair of spaced directional seals located away from the outlet, an open volume residing between the seals and an external port opening the open volume to atmosphere. A stepped plunger extends axially within the pumping chamber, with a first portion sized to be received and aligned through the first directional seal, the plunger being movable to move the first portion toward the outlet to close off the internal volume at the second seal. The second portion of the plunger is relatively smaller in transverse cross-sectional dimension than the inside diameter of the second seal, to cooperate with the port to promote fluid removal from the internal volume during initial filling and priming of the pumping chamber. Once filled and primed, the plunger causes positive volume displacement of liquid from the pumping chamber and out of the nozzle, with very good repeatability and high fluid flow rates, independent of material viscosity, and/or temperature or viscosity changes. For refilling, the plunger is retracted from a volume which corresponds to the volume of material refilled into the internal volume.

17 Claims, 2 Drawing Sheets

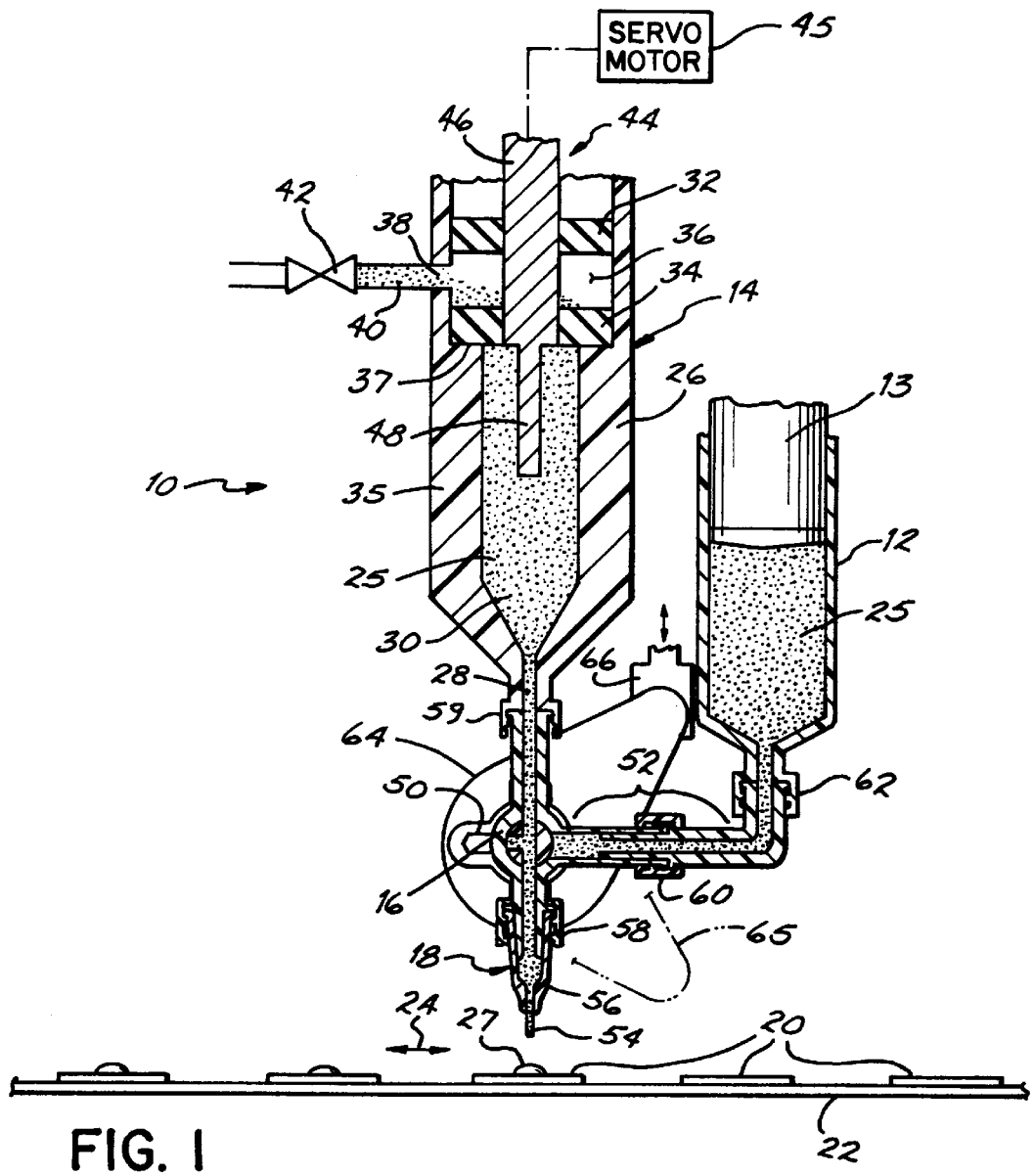
FIG. 1
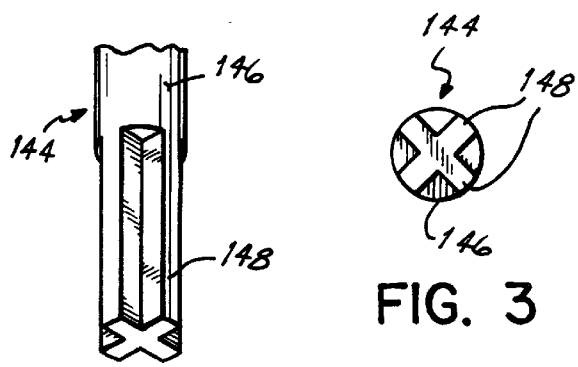
FIG. 2
FIG. 3

DISPENSING PUMP FOR EPOXY ENCAPSULATION OF INTEGRATED CIRCUITS

FIELD OF THE INVENTION

This invention relates to precise dispensing of liquid, and more particularly to a dispensing pump suitable for dispensing epoxy to encapsulate integrated circuits.

BACKGROUND OF THE INVENTION

In the dispensing of minute, precise quantities of liquid, such as the dispensing of epoxy to encapsulate portions of integrated circuits, it is important to achieve and maintain high repeatability in the dispensing quantity, notwithstanding possible variations in the temperature and/or viscosity of the liquid. For some applications, the liquid dispensed is extremely sensitive to such changes. For instance, in encapsulating integrated circuits, it is typical to use a two component epoxy which is premixed by the epoxy manufacturer and then frozen. The epoxy must then be used within a few days, and in some instances within several hours.

For typical dispensing operations, an epoxy for encapsulating of this type will have a relatively high viscosity. However, as the temperature changes, the viscosity is also subject to change. These viscosity variations can affect dispensing volumes, particularly if a positive volume displacement device is used to dispense the epoxy. For a given set of dispensing stroke parameters, i.e., displacement distance, force and rate, the dispensing result will vary with variations in viscosity.

Another problem relates to air or bubble entrapment within the liquid to be pumped from the pumping device. Obviously, if a displacement pump is compressing entrapped air during the displacement strike, the relationship between the displacement stroke and the dispensed volume will become distorted.

Most of the premixed two part epoxies used for encapsulations of this type contain an abrasive fill material, such as silica. This abrasive filler can cause undue wear on dispensing apparatus, again adversely affecting dispensing and/or resulting excessive downtime due to the need to repair or replace worn components.

While auger pumps have been used in the past to perform precise quantity dispensing of this type, the output of a typical auger pump varies directly with variations in the viscosity of the dispensed fluid, the needle size and the supply pressure. While the effect of viscosity changes and the fluid flow rate can be minimized with proper pump design, advanced calibration techniques and manual adjustments of the valve operation are required. Thus, the maximum possible mass flow rate while maintaining accuracy is limited.

SUMMARY OF THE INVENTION

It is an object of the invention to achieve, in liquid dispensing of relatively high viscosity materials, high repeatability of dispensed volume at high flow rates, independent of the viscosity of the material.

It is another object of the invention to improve accuracy in the dispensing of liquids, by eliminating problems associated with air entrapment and/or viscosity or temperature changes in the liquid.

It is still another object of the invention to improve upon accuracy and performance capacity in the encapsulation of integrated circuits, by minimizing adverse affects, such as downtime, which indirectly result from the abrasive filler typically used in two component premixed epoxies.

The invention achieves the above-stated objectives by using a stepped plunger within a pumping chamber, in combination with two seals and an open volume therebetween, to actively prime the pumping chamber by removing any air or entrapped bubbles from liquid filled into the pumping chamber prior to dispensing. After priming, further movement of the plunger causes a true volume displacement outwardly from an outlet of the pumping chamber.

Thus, regardless of the viscosity or the temperature of the liquid, particularly a two-part epoxy used for encapsulation, the interrelationship among the two-step plunger, the seals and the pumping chamber assures that the volume of fluid displaced by the advancing plunger equals the volume displaced from the pumping chamber. Stated another way, the arrangement of these components assures, after filling and priming of the pumping chamber, that the internal chamber sealed by the plunger includes only the incompressible fluid to be dispensed.

The plunger may be repeatedly driven into the liquid material within the pumping chamber to dispense dots or discrete streams of material, until the internal chamber needs to be refilled. By driving the piston at a controlled rate, the volume of material dispensed during a shot can be accurately determined by the amount of time the piston is drive downward, by varying the time that the piston is actuated, different volumes of material may be dispensed. Since the diameter of the piston is known, then the amount of material displaced per unit time is also known and the total volume of material dispensed can easily be calculated. Applicant has used a servo driven d.c. motor to provide a high degree of control and movement of the plunger, enabling programmable movement of the plunger to dispense a precise desired volume in the range of about 3 Microliters to 500 Microliters, or even a thousand Microliters.

According to a preferred embodiment of the invention, a dispensing pump includes a pumping chamber operatively connected to a supply syringe and a dispensing nozzle via a three position, four way valve, which is controlled automatically to connect the supply syringe with the pumping chamber during filling and priming, and to connect the pumping chamber with the nozzle during dispensing. The pumping chamber has a surrounding side wall which defines an internal volume or chamber for the dispensing liquid, with an outlet located at one end thereof. Opposite the outlet and axially aligned therewith, the pumping chamber includes a stepped plunger, having a relatively large first portion located farther from the outlet than a relatively smaller second portion. The first portion is circular in transverse cross sectional shape. The recessed portion may be circular, but of smaller diameter, or may be of another shape so long as the transverse cross sectional area is less than that of the first portion. A drive mechanism, preferably a servo driven d.c. motor, operatively connects to the first portion of the plunger to reciprocally move the plunger within the pumping chamber, along the axis.

The plunger extends axially through two seals. The first seal at all times sealingly engages the first portion of the plunger. Both seals have central passages therethrough sized to correspond to the outer diameter of the first portion of the plunger. The second seal resides between the first seal and the outlet. It may be supported by an internal shoulder defined by a thicker region of the side wall. The axial spacing between the seals defines an open volume, and a port in the side wall permits venting of the pumping chamber to allow venting of entrapped air during initial filling, and during priming of the pumping chamber as the plunger moves toward the outlet to eventually locate the first portion thereof in contact with the second seal.

Because the plunger and the seals cooperate to remove entrapped air from the internal volume during priming, leaving only the incompressible fluid to be dispensed within the internal volume, further movement of the plunger toward the outlet causes true positive displacement of liquid from the pumping chamber. Thus, high repeatability in the dispensing of minute quantities is achieved independent of temperature or viscosity changes, even at relatively high flow rates.

The dispensing pump of this invention also improves upon prior art dispensers relative to its ability to dispense a viscous epoxy with an abrasive filler. More specifically, the epoxy flow channels may be made relatively large in size so that the potential for clogging is minimized. Also, the relatively simple construction and the use of off-the shelf replaceable components for the fluid interconnections helps to minimize downtime when it is necessary to replace worn components. As for the pumping chamber, the side walls, the seals and the piston are also readily accessible and fairly simple to manufacture, and/or assemble at start-up, changeover or upon replacement. All of these features provide advantages in epoxy encapsulation of integrated circuits.

These and other features of the invention will be more readily understood in view of the following detailed description and the drawings.

BRIEF DESCRIPTION OF THE DRAWINGS

FIG. 1 is a cross-sectional schematic which illustrates a dispensing pump in accordance with a first preferred embodiment of the invention, during dispensing.

FIG. 2 is a cross-sectional view taken along lines 2—2 of FIG. 1.

FIG. 3 is a side view of a stepped plunger in accordance with a second preferred embodiment of the invention.

DETAILED DESCRIPTION OF THE DRAWINGS

Figure 4:
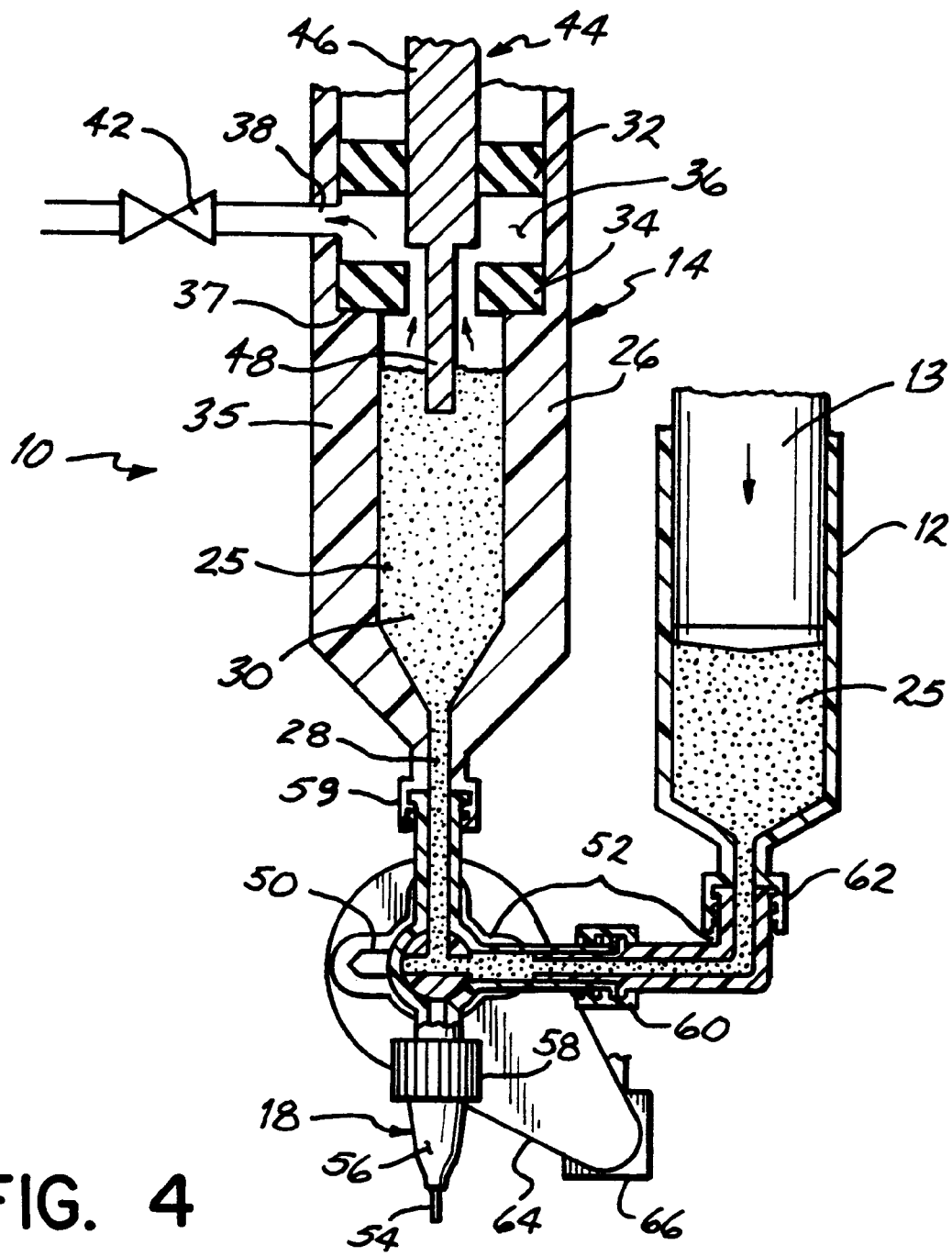
FIG. 4 is a cross-sectional view similar to FIG. 1, showing initial filling of the pumping chamber.

FIG. 1 shows a dispensing pump 10 for high accuracy dispensing of epoxy for encapsulation of integrated circuits in accordance with a first preferred embodiment of the invention. The dispensing pump 10 includes a supply syringe, or cartridge 12, for supplying epoxy under pressure, as by a piston 13 or by air pressure, to an adjacently mounted pumping chamber 14. The pumping chamber 14 delivers the liquid to a dispensing nozzle 18, via a valve 16, and therefrom toward an integrated circuit 20 residing on a support 22, which may be moved relative to the nozzle 18, as shown by directional arrows 24. The cartridge 12 may be any conventional cartridge style which supplies the desired volume of epoxy and at the desired pressure. Typical volumes for such a cartridge are in the range of about 3 to 180 cubic centimeters. Typical air pressures for supplying the epoxy to the pumping chamber 14 are in the range of about 50–80 psi.

As noted above, the epoxy typically used for encapsulating integrated circuits is a premixed two component epoxy with an abrasive filler, usually silica. This epoxy is typically premixed by a supplier and then frozen and shipped to an end user. It then must be used within several days, and in some cases within several hours. Because of the silica, this epoxy is particularly abrasive for a dispensing apparatus of this type. Moreover, it is subject to viscosity changes because of its temperature sensitivity.

The dispensing pump 10 of this invention is a true positive displacement pump, designed to deliver highly repeatable quantities of liquid 25 at high flow rates, independent of material viscosity. The pumping chamber includes a rigid side wall 26 which defines an outlet 28 and an internal volume 30, with the outlet 28 being located at the vertical bottom of the internal volume in the preferred embodiment, although other orientations are also contemplated. The side wall 26 is preferably anodized aluminum with a surface finish, or any other suitably rigid and compatible material. The pumping chamber 14 includes a first directional seal 32 and a second directional seal 34 spaced axially therefrom, to define an open volume 36 therebetween. The seals 32, 34 are preferably thermoplastic, such as a polyimide. A port 38 in the side wall 26 of the pumping chamber 14 communicates with a fluid outlet line 40, and the fluid flow along the line 40 is controlled by a valve 42.

A plunger 44 is supported along the center axis of the pumping chamber 14, extending through the first directional seal 32, and the second directional seal 34 and in alignment with the outlet 28 and the nozzle 18. The plunger 44 has a stepped configuration with a relatively large diameter first portion 46 and a relatively smaller second portion 48. The plunger 44 is preferably of stainless steel, although as with the side wall 26, it may be of any suitably rigid and compatible material, such as a machinable plastic. In FIG. 1, the first portion 46 is located above the second portion 48. The diameter of the second portion 48 is less than the inner diameter of the second directional seal 34. Or alternatively, the transverse cross-sectional dimension of the second portion 48 is such that it permits fluid flow between the internal volume 30 and the open volume 36. The outer diameter of the first portion 48 is at least as great as, and preferably slightly greater than, the internal diameter of the first and the second directional seals 32, 34, to prevent fluid flow to and from the open volume 36 during dispensing.

Downward movement of the stepped plunger 44 through the liquid 25 contained within the internal volume 30, preferably the two component epoxy referred to above, displaces the liquid 25 from the pumping chamber 14 via the outlet 28, through the valve 16, through the nozzle 18 and then outwardly therefrom toward the substrate 20. Movement of the plunger 44 is preferably controlled by a d.c. servo driven motor 45.

The valve 16 is preferably a three position, four way valve of the type sold by Medex Inc., under Model No. B1934-1L. This valve 16 is a four way rotary valve which is capable, via toggle operation of a switch 50, of selectively interconnecting the internal volume 30 with the nozzle 18, or the internal volume 30 with the supply syringe 12, via a conduit 52 extending therebetween.

Preferably, the nozzle 18 includes cylindrical tip 54 residing in a tight fit within a plastic casing 56, which preferably interconnects with the valve 16 via a Luer lock interconnection 58, as is well known and conventional in the dispensing industry, particularly dispensing with respect to medical devices. Similarly, a second Luer lock connection 59 resides between the valve 18 and pumping chamber 14, and yet a third Luer lock connection 60 interconnects the conduit 52 with valve 16, and a fourth Luer lock interconnection 62 interconnects the syringe 12 with the conduit 52.

In a preferred manner of moving switch 50 of valve 16 to selectively interconnect the syringe 12 and the pumping chamber 14, or the pumping chamber and the nozzle 18, the invention provides a shaped fitting, or adapter, 64 with an internal recess which is complementary in shape to the switch 50 of the valve 16. The fitting 64 operatively interconnects via a mechanical member 66 to a controllable actuator of some type, such as a pneumatic cylinder or an electrical solenoid. Selective control of the actuator causes the fitting 64, and hence the switch 50 held thereby, to toggle back and forth between the two selected positions to control fluid flow through the valve 16.

FIG. 2 shows a side view of a plunger 144 in accordance with a second preferred embodiment of the invention, wherein the first portion 146 is identical to the first portion 46 of plunger 44 shown in FIG. 1. However, the second portion 148 of plunger 144 differs in cross-sectional dimension, with four symmetrically arranged open sections 149 extending therealong, as shown best in FIG. 3.

In operation of the dispensing pump 10, the cartridge or syringe 12 filled with the premixed two-party epoxy is mounted to the fourth Luer lock 62. With the valve 16 open so as to permit flow between the syringe 12 and the pumping chamber 14, either the piston 13 is driven or air pressure is supplied to the inside of the syringe 12, typically on the order of 50 to 80 psi, to cause the epoxy to flow through the conduit 52, through the valve 16 and into the internal volume 30, preferably filling the internal volume 30. If air pressure is used, the air pressure to the syringe 12 is supplied via an air supply port (not shown) and pressurized air supply (not shown).

During initial filling of the internal volume 30 epoxy, as shown in FIG. 4, the valve 16 remains open between the syringe and the pumping chamber 14, and valve 42 in fluid communication with open volume 36 also remains open, to enable fluid to flow outwardly from the internal volume 30, completely filling volume 30 with incompressible fluid. After the internal volume 30 is filled completely, determined either by the duration of filling or visual detection of liquid 25 flow out of port 38, the plunger 44 is then moved downwardly to locate first portion 46 within the second directional seal 34. This movement of the plunger 44 primes the pumping chamber 14, to result in an internal volume 30 completely filled with the incompressible epoxy liquid 25, with no air entrapped therein. The switch 50 of the valve 16 is then moved to open the fluid connection between internal volume 30 and nozzle 18. Thereafter, further movement of the plunger 44 toward the outlet 28 causes positive volume displacement of fluid 25 from the internal volume 30 through outlet 28. Control of the plunger 44, preferably by a d.c. servo driven motor 45, provides a high degree of control and accuracy to achieve dispensing of repeatable quantities of liquid.

This dispensing pump 10 is particularly suitable for encapsulating integrated circuits on a substrate 20, which is in turn located on a support 22. This is typically done during relative movement of the dispensing pump 10 with respect to the support 22, as indicated by directional arrows 24. This relative movement may be affected by mounting the dispensing pump on a robot (not shown) or by moving the support past the nozzle 18 in conveyor like fashion.

Preferably, control of the components of the dispensing pump 10 is coordinated in an automated manner, this control including the force or the air pressure supplied to the liquid 25 in the supply syringe 12, operation of the pneumatic cylinder to control movement of the fitting 64 and the switch 50 held thereby, opening and closing of valve 42 for venting the internal volume 30 during the initial filling, and perhaps most importantly, reciprocal movement of the plunger 44 with respect to the pumping chamber 14.

Typically, up to fifty parts, or even more, may be encapsulated via a like number of downward movements of the plunger 44, prior to resuming the refilling operations. To refill the pumping chamber 14, the valve 16 is closed to interconnect the syringe 12 and the pumping chamber 14, and the plunger 44 is retracted to a position where the large cross section 46 of the plunger 44 remains below direct seal 34, as shown in FIG. 1. The liquid 25 is again driven into the internal volume 30 to refill it to a desired level. The volume of liquid 52 refilled into internal volume 30 is preferably controlled so as to match the volume occupied by the plunger 44 prior to retraction. There is no need for priming after refilling, only upon initial filling with a new cartridge 12. If desired retraction of plunger 44 and refilling of liquid 25 from cartridge 12 may occur and be controlled simultaneously.

In using the invention, applicant has achieved zero drip with intermittent dispensing of liquid having a viscosity of one centipoise. The invention is suitable for use with liquids having a range in viscosity from 1 to 1 M centipoise. The invention is capable achieving accuracy in dispensing with flow rates ranging from 0.006 cc per second to 1 cc per second, and with a shot size ranging from 0.002 cc to 2 cc and with an accuracy better than 1%.

While a preferred embodiment of the invention has been described, that embodiment is to be understood as exemplary in nature, since those skilled in the art would readily appreciate that a number of variations may be made therefrom without departing from the scope of the invention. For instance, the transverse cross sectional shape of the central passages of the seals, and the outer shape of the large portion of the plunger need not be circular, so long as a fluid tight seal is created therebetween. Thus, the disclosed and described embodiment should be regarded as exemplary in nature and not limiting in nature. Applicants wish to be limited only by the following claims.

We claim:

1. A liquid dispenser comprising:

a pumping chamber having a peripheral side wall defining an internal volume, with an outlet located at one end thereof and a port formed in the side wall and spaced from the outlet;

a pair of seals located in the pumping chamber, on opposite sides of the port to define an open volume therebetween, the seals including aligned passages, and a plunger mounted in the pumping chamber so as to extend through the passages of the seals, and being reciprocally movable toward and from the outlet, the plunger including a first portion sized to create a fluid tight seal with the passage of each of the seals when residing therein and a second portion of smaller transverse cross sectional area than the passage of the second seal so as to permit axial fluid flow between opposite sides of the second seal when the second portion resides therein, so that with the internal volume filled with a liquid to be dispensed and the plunger extended through the seals so as to create fluid tight seals at the first and second seals, the further movement of plunger toward the outlet causes positive displacement of liquid outwardly through the outlet.

2. The liquid dispenser of claim 1 wherein the pumping chamber is cylindrical in shape, and the side wall defines a generally cylindrical internal volume.

3. The liquid dispenser of claim 1 wherein the side wall includes a section of increased thickness which terminates in a shoulder, the second seal bearing against the shoulder.

4. The liquid dispenser of claim 1 wherein the passages of the seals are aligned axially with the outlet.

5. The liquid dispenser of claim 1 wherein the passages of the seals and the outer perimeter of the first portion of the plunger are circular in transverse cross section.

6. The liquid dispenser of claim 5 wherein the second portion of the plunger is also circular in transverse cross section.

7. The liquid dispenser of claim 5 wherein the second portion of the plunger is cross-shaped in transverse cross section.

8. A liquid dispenser comprising:

a pumping chamber having a rigid peripheral side wall defining an internal volume, and an outlet at a first end of the internal volume;

a pair of seals mounted in the pumping chamber at a second end thereof opposite the first, in spaced apart relationship with an open volume residing therebetween, the side wall defining a port for the pumping chamber, each of the seals including a central passage;

a plunger supported in the pumping chamber in axial alignment with the outlet and extending axially through the central passages of the seals, the plunger including a first portion sized to extend sealingly through the central passage of the first seal, the plunger further including a second portion smaller in transverse cross sectional area than the first portion; and a drive mechanism operatively connected to the piston to reciprocally drive the piston to and from the outlet, whereby after filling of the internal volume with a liquid to be dispensed, movement of the plunger toward the outlet until the first portion of the plunger seats inside the second seal causes priming of the pumping chamber, so that further movement of the plunger toward the outlet causes positive displacement of liquid outwardly through the outlet.

9. The liquid dispenser of claim 8 and further comprising:

an outlet line connected for fluid communication with the port, and a valve located along the outlet line to permit selective venting and closing of the pumping chamber to atmosphere.

10. The liquid dispenser of claim 8 and further comprising a connector valve operatively connected to the outlet, and a dispensing nozzle and supply cartridge also operatively connected to the valve, whereby the valve may be operated to place the supply cartridge and the pumping chamber in fluid communication for filling and priming of the pumping chamber, and also operated to place the pumping chamber and the dispensing nozzle in fluid communication for dispensing.

11. The liquid dispenser of claim 10 wherein the connector valve is a rotary valve with a manually operable switch, and further comprising an adapter shaped complementary to the switch for coupling the rotary valve to an automated actuation mechanism.

12. The dispensing apparatus of claim 8 wherein the drive mechanism is a servo driven d.c. motor.

13. The liquid dispenser of claim 1 wherein the pumping chamber is cylindrically shaped and includes a section of increased thickness which terminates in a shoulder, the second seal bearing against the shoulder.

14. A liquid dispenser comprising:

a pumping chamber defining an internal volume, with an outlet located at one end thereof and a port spaced from the outlet;

a pair of seals located in the pumping chamber, on opposite sides of the port to define a volume therebetween, the seals including aligned passages, and a plunger mounted in the pumping chamber so as to extend through the passages of the seals, and being reciprocally movable toward and away from the outlet, the plunger forming a fluid tight seal with the passage of each of the seals when residing therein in a first position and, in a second retracted position, permitting axial fluid flow between opposite sides of the second seal, and with the internal volume of the pumping chamber filled with a liquid to be dispensed and the plunger extended through the seals in said first position, the further movement of plunger toward the outlet causes positive displacement of liquid outwardly through the outlet.

15. The liquid dispenser of claim 14 further comprising:

an outlet line connected for fluid communication with the port, and a valve located along the outlet line to permit selective venting and closing of the pumping chamber to atmosphere.

16. The liquid dispenser of claim 14 further comprising:

a connector valve operatively connected to the outlet, and a dispensing nozzle and supply cartridge also operatively connected to the valve, whereby the valve may be operated to place the supply cartridge and the pumping chamber in fluid communication for filling and priming of the pumping chamber, and also operated to place the pumping chamber and the dispensing nozzle in fluid communication for dispensing.

17. The liquid dispenser of claim 16 wherein the connector valve is a rotary valve with a manually operable switch, and further comprising an adapter shaped complementary to the switch for coupling the rotary valve to an automated actuation mechanism.

* * * * *